United States Patent
van Dijk

(10) Patent No.: US 8,570,075 B2
(45) Date of Patent: Oct. 29, 2013

(54) GATE DRIVER WITH DIGITAL GROUND

(75) Inventor: Luc van Dijk, Kranenburg (DE)

(73) Assignee: NXP B.V., Eindhoven (NL)

( * ) Notice: Subject to any disclaimer, the term of this patent is extended or adjusted under 35 U.S.C. 154(b) by 93 days.

(21) Appl. No.: 13/339,433

(22) Filed: Dec. 29, 2011

(65) Prior Publication Data

US 2013/0169320 A1  Jul. 4, 2013

(51) Int. Cl.
  *H03B 1/00*  (2006.01)
(52) U.S. Cl.
  USPC ............ 327/109; 327/309; 327/387; 361/111
(58) Field of Classification Search
  USPC ......... 327/109–112, 309, 314, 387–389, 391; 361/92, 91.1, 111
  See application file for complete search history.

(56) References Cited

U.S. PATENT DOCUMENTS

| | | | | |
|---|---|---|---|---|
| 5,274,274 A | * | 12/1993 | Leman et al. | 327/74 |
| 6,657,399 B2 | * | 12/2003 | Adams et al. | 315/224 |
| 7,214,985 B2 | * | 5/2007 | Lotfi et al. | 257/336 |
| 8,049,479 B2 | * | 11/2011 | Shiraishi et al. | 323/282 |
| 2007/0195563 A1 | | 8/2007 | Shiraishi et al. | |
| 2009/0057869 A1 | | 3/2009 | Hebert et al. | |
| 2009/0097291 A1 | * | 4/2009 | Bormann | 363/126 |
| 2009/0261462 A1 | | 10/2009 | Gomez | |
| 2010/0194451 A1 | | 8/2010 | Nuutinen | |

FOREIGN PATENT DOCUMENTS

EP  2020749 A1  2/2009

* cited by examiner

*Primary Examiner* — An Luu

(57) ABSTRACT

Various exemplary embodiments relate to gate driver circuitry that compensate for parasitic inductances. Input buffers in the gate driver are grounded to an exposed die pad. Grounding may involve either a downbond or conductive glue.

19 Claims, 6 Drawing Sheets

GATE DRIVER WITH DIGITAL GROUND

TECHNICAL FIELD

Various exemplary embodiments disclosed herein relate generally to a gate driver circuit that compensates for parasitic inductances.

BACKGROUND

Gate driver circuits may be used to drive gates of power Metal Oxide Semiconductor Field Effect Transistors (MOSFETS) or Insulated Gate Bipolar Transistors (IGBTs).

Gate drivers may be used in two channel devices, also known as dual channel devices. Such devices may drive power devices having both low and high sides. A common Integrated Circuit (IC) package, known as SO-8, may use a chip having eight connectors. Such connectors may also be known as pins.

Conventional gate drivers may have a problem with parastic inductances on the Printed Circuit Board (PCB). Such parasitic inductances may cause unwanted voltage excursions of the reference voltage both above and below the ground level.

Another problem may involve instability of the reference voltage for the input side of the gate driver. As this reference is noisy, the input levels may be characterized by unwanted toggling.

FIG. 1 illustrates propagation delay definitions for a gate driver circuit. Propagation delay, $t_{pd}$, is an important characteristic for gate driver circuits. As shown in FIG. 1, a common definition of propagation delay involves a time difference between the initial time when an input signal rises above the 50% level and the subsequent time when the output signal rises above the 10% level. See $t_{pd\,(L-LG)\,on}$ to $t_{pd\,(H-HG)\,on}$. A second propagation delay definition involves the time difference between the initial time when the input signal falls below the 50% level and the subsequent time when the output signal falls below the 90% level. See $t_{pd\,(L-LG)\,off}$ to $t_{pd\,(H-HG)\,off}$.

FIG. 2 illustrates an exemplary related art gate driver 200 embodiment that uses input filters 208/209. Gate driver 200 includes a high input buffer 202, a low input buffer 203, a high undervoltage monitor 204, a low undervoltage monitor 205, a high output driver 206, and a low output driver 207. High input filter 208 and low input filter 209 are respectively coupled to the input sides of high input buffer 202 and low input buffer 203.

Microcontroller 240 includes a high input line 220 coupled to high input filter 208 and a low input line 230 coupled to low input buffer 209. The related art embodiment assumes that unwanted voltage excursions only occur for a limited period of time. Thus, related art devices may add respective input filter 208/209 before the input buffers 202/203 to prevent propagation of the unwanted voltage excursions. However, this solution has a significant drawback because it adds delay to both the H and L paths. Thus, there is a need for an improved gate driver circuit.

SUMMARY

A brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to a system for supplying power, the system comprising a gate driver comprising at least one input buffer, at least one undervoltage monitor, at least one output driver, and an exposed die pad, wherein a ground of the at least one input buffer is coupled to the exposed die pad; a microcontroller coupled to the gate driver; a first ground coupled to both the exposed die pad and the microcontroller, wherein the ground compensates for parasitic inductances of the at least one input buffer; and a second ground coupled to a connector of the gate driver.

In some embodiments, a downbond between silicon and the exposed die pad may provide the first ground. In other embodiments, conductive glue between silicon and the exposed die pad may provide the first ground.

Various exemplary embodiments further relate to at least one input buffer that may comprise both a high input buffer and a low input buffer. Grounds of both the high input buffer and the low input buffer may be coupled to the first ground.

In various exemplary embodiments, the system may have only eight connectors. The eight connectors may be H, L, HC, HG, HS, LC, LG, and LS connectors. The microcontroller may be coupled to both the H connector and the L connector.

Various exemplary embodiments further relate to the at least one output driver comprising a high output driver and a low output driver respectively coupled to HG and LG connectors. A first transistor may be coupled to the HG connector and a second transistor may be coupled to the LG connector.

In some embodiments, the first ground may be a digital ground and the second ground may be an analog ground.

Various exemplary embodiments relate to a gate driver, the gate driver comprising at least one input buffer; at least one undervoltage monitor; an exposed die pad that provides a digital ground; at least one output driver, wherein a ground of the at least one input buffer is coupled to the exposed die pad; and an output connector that provides an analog ground.

In some embodiments, a downbond between silicon of the gate driver and the exposed die pad may provide the digital ground. In other embodiments, conductive glue between silicon of the gate driver and the exposed die pad may provide the digital ground.

In various exemplary embodiments, the at least one input buffer may further comprise a high input buffer and a low input buffer. Grounds of both the high input buffer and the low input buffer may be coupled to the digital ground.

In various exemplary embodiments, the at least one output driver may further comprise a high output driver and a low output driver. The high output driver and the low output driver may be respectively coupled to HG and LG connectors.

In various exemplary embodiments, the gate driver may be implemented upon an Integrated Circuit (IC) having only eight connectors. The eight connectors may be H, L, HC, HG, HS, LC, LG, and LS connectors.

BRIEF DESCRIPTION OF THE DRAWINGS

In order to better understand various exemplary embodiments, reference is made to the accompanying drawings, wherein.

DETAILED DESCRIPTION

Figure 1:
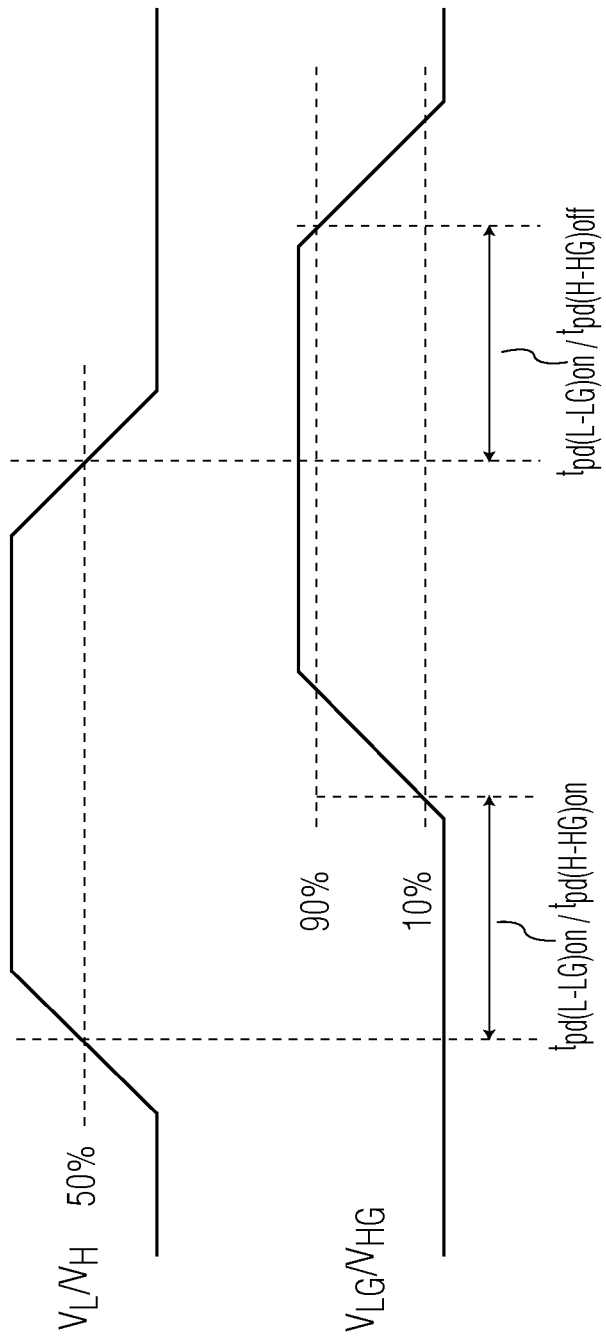
FIG. 1 illustrates propagation delay definitions.
Figure 2:
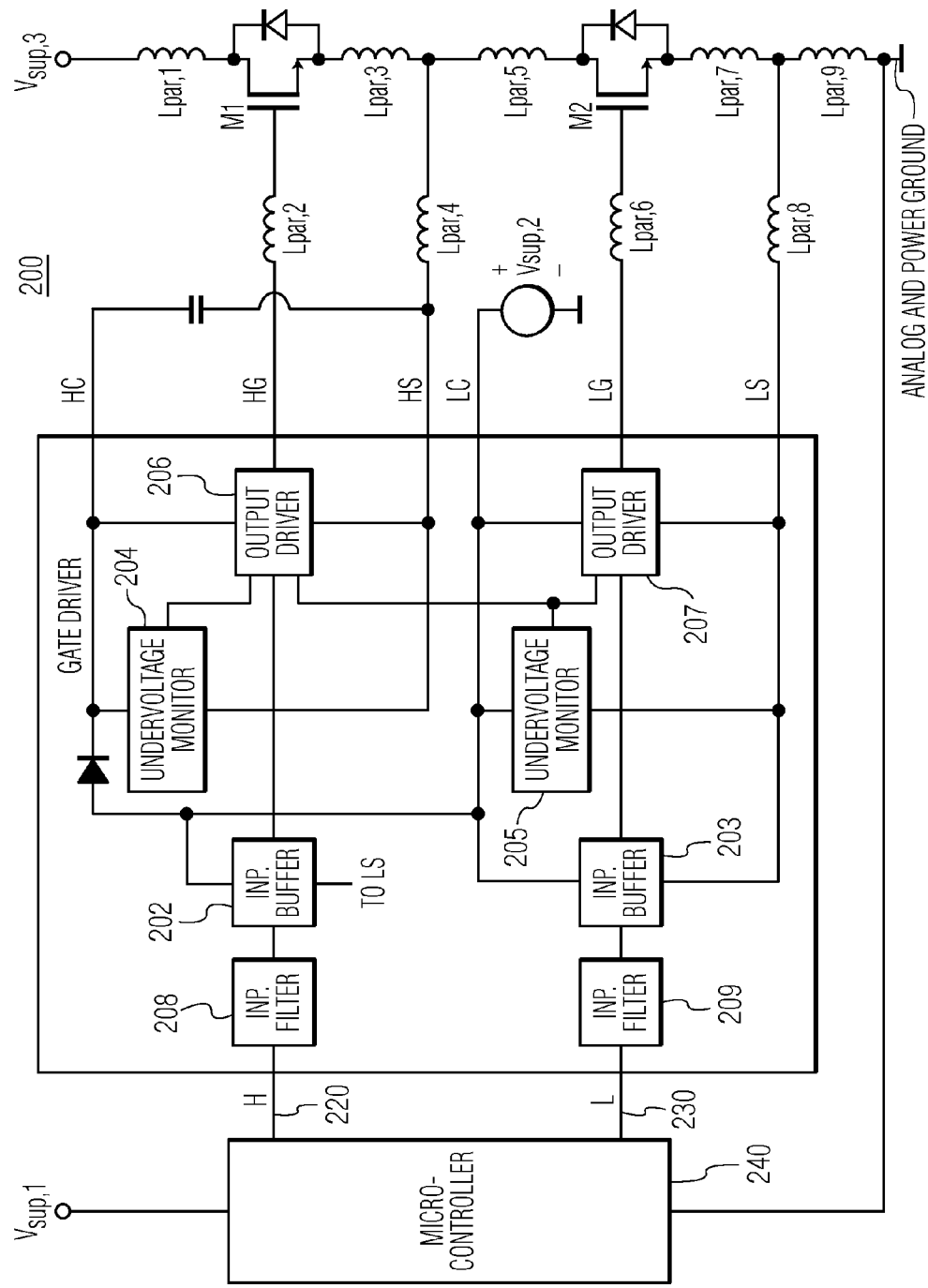
FIG. 2 illustrates a related art gate driver that uses an input filter.

Referring now to the drawings, in which like numerals refer to like components or steps, there are disclosed broad aspects of various exemplary embodiments.

It should be appreciated by those skilled in the art that any block diagrams herein represent conceptual views of illustrative circuitry embodying the principles of the embodiments of the invention.

Figure 3:
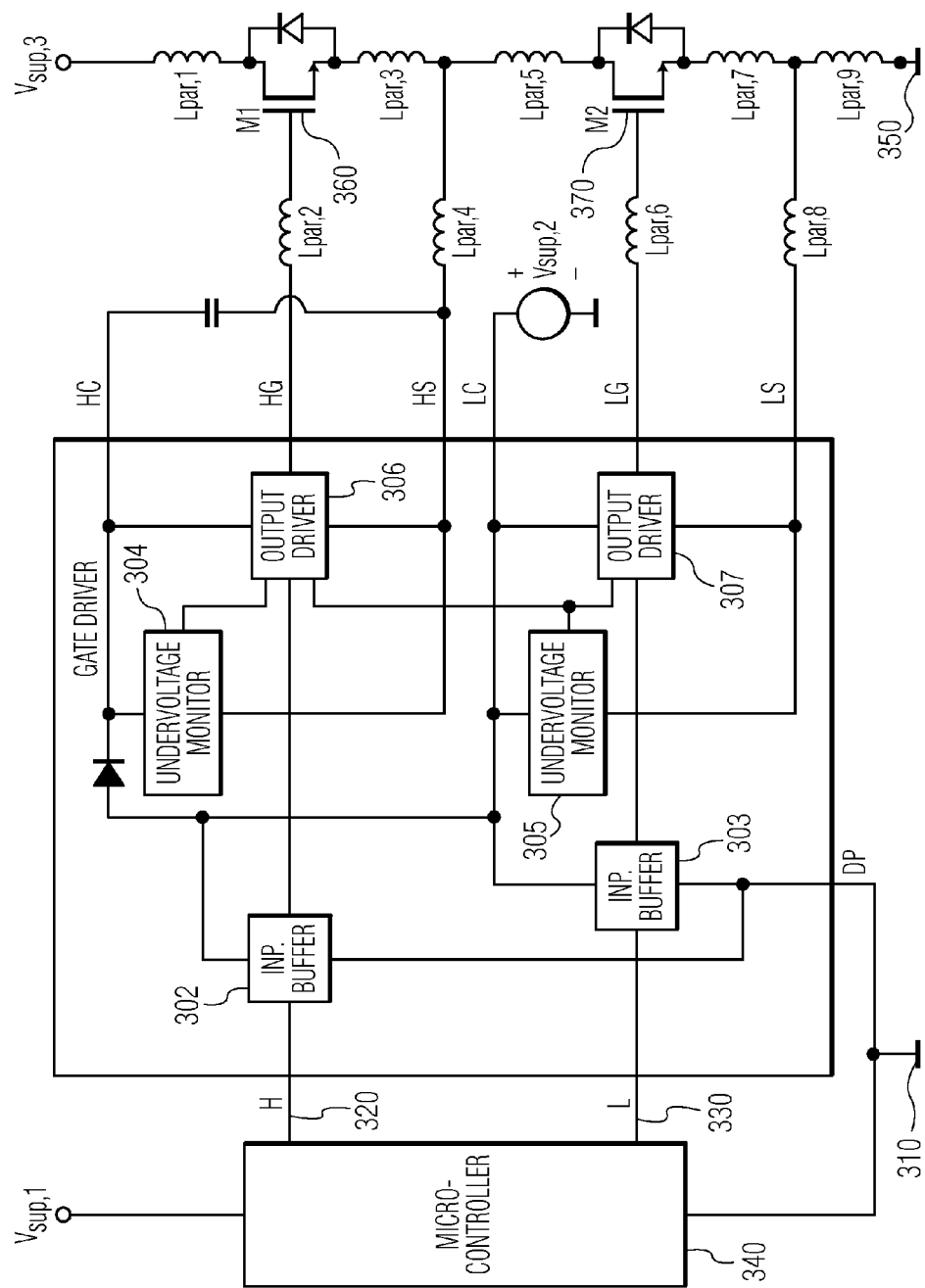
FIG. 3 illustrates an embodiment of a gate driver.

FIG. 3 illustrates an embodiment of a gate driver 300. Gate driver 300 may include a high input buffer 302, a low input buffer 303, a high undervoltage monitor 304, a low undervoltage monitor 305, a high output driver 306, and a low output driver 307. Both high input buffer 302 and low input buffer 303 may be coupled to ground 310. Ground 310, as described in more detail below, may be an exposed die pad DP. Gate driver may also have eight external connectors. The eight connectors may be H, L, HC, HG, HS, LC, LG, and LS connectors.

Microcontroller 340 may have a high input line 320 coupled to high input buffer 302 and a low input line 330 coupled to high input buffer 303. Microcontroller 340 may be a Digital Signal Processor (DSP). A voltage reference of microcontroller 340 may be the same as ground 310. Microcontroller 340 may be coupled to both the H connector and the L connector. Transistor 360 and transistor 370 may be respectively coupled by their gates to the HG connector and the LG connector.

As depicted in FIG. 3, ground 310 may not involve an additional connector or pin. Instead, an exposed die pad DP may be used as a ninth connection.

In an exemplary embodiment, a connection between the voltage reference of the input buffers 302/303 and the voltage reference of the microcontroller 340 may be realized by a bondwire between the input buffer voltage reference and the exposed die pad DP. Thus, ground 310 may serve as both voltage references. Ground 310 may also be considered to be a digital ground.

There also may be a connection on the Printed Circuit Board (PCB) between the exposed die pad and the voltage reference of the microcontroller 340.

An LS connector of gate driver 300 may be connected to ground 350, which is separate from ground 310. Ground 350 may be considered to be an analog ground or a power ground. Separation of ground 310 from ground 350 may provide various benefits.

While the device may have an additional connection compared to conventional eight-connector packages, the actual connector count may not increase.

A first advantage involves high immunity to noise transients on the LS connector. The voltage reference of the LS connector may be decoupled from the voltage reference of the input buffers 302/303. A second advantage may involve avoidance of propagation delay. A third advantage may involve compliance with common connector and package requirements. Even though there is a ninth connection, the total connector count remains eight. Also, there may be no increase in board space or package costs.

Figure 4:
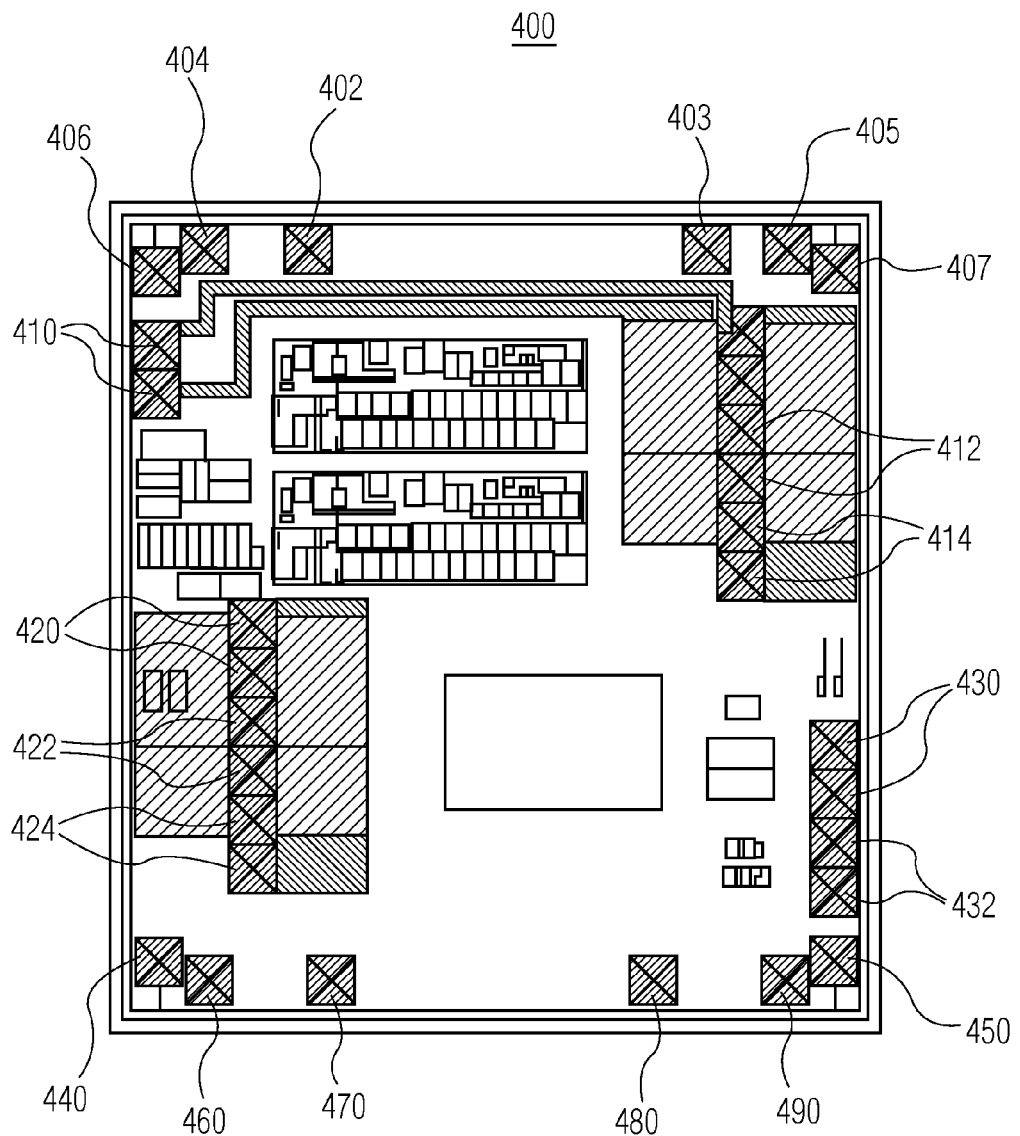
FIG. 4 illustrates a die plot diagram for the gate driver of FIG. 3.

FIG. 4 illustrates a die plot diagram for the gate driver circuit 300 of FIG. 3.

As depicted in FIG. 4, an exemplary test chip 400 may include, in the upper portion of the die plot diagram, HSgateOFF 402, LSgateOFF 403, HSpulseP 404, and LSpulseP 405. HSpulseN 406 and LSpulseN 407 may appear respectively, on the left and right sides of the die plot diagram, below HSpulseP 404, and LSpulseP 405.

The upper half of test chip 400 may include, on its left side, a pair of LC nodes 410. Pairs of LG nodes 412 and LS nodes 414 may appear on its right side.

Continuing to the lower half of test chip 400, pairs of HC nodes 420, HG nodes 422, and HC nodes 424 may be present on its left side. Pairs of L/LSgateON nodes 430 and H/HSgateON nodes 432 may appear on the left side. A DATAIN/IrefTest node 440 may appear near the bottom on the left side of test chip 400 while a GND node 450 may appear near the bottom on the right side of test chip 400.

Four nodes may appear along the bottom side of test chip 400. CLK node 460 may be on the extreme left, near DATAIN node 440. Nodes isr_pwrok 470, VBG 480, and vdda1v8 490 then may appear in sequence along the bottom side of test chip 400.

Figure 5:
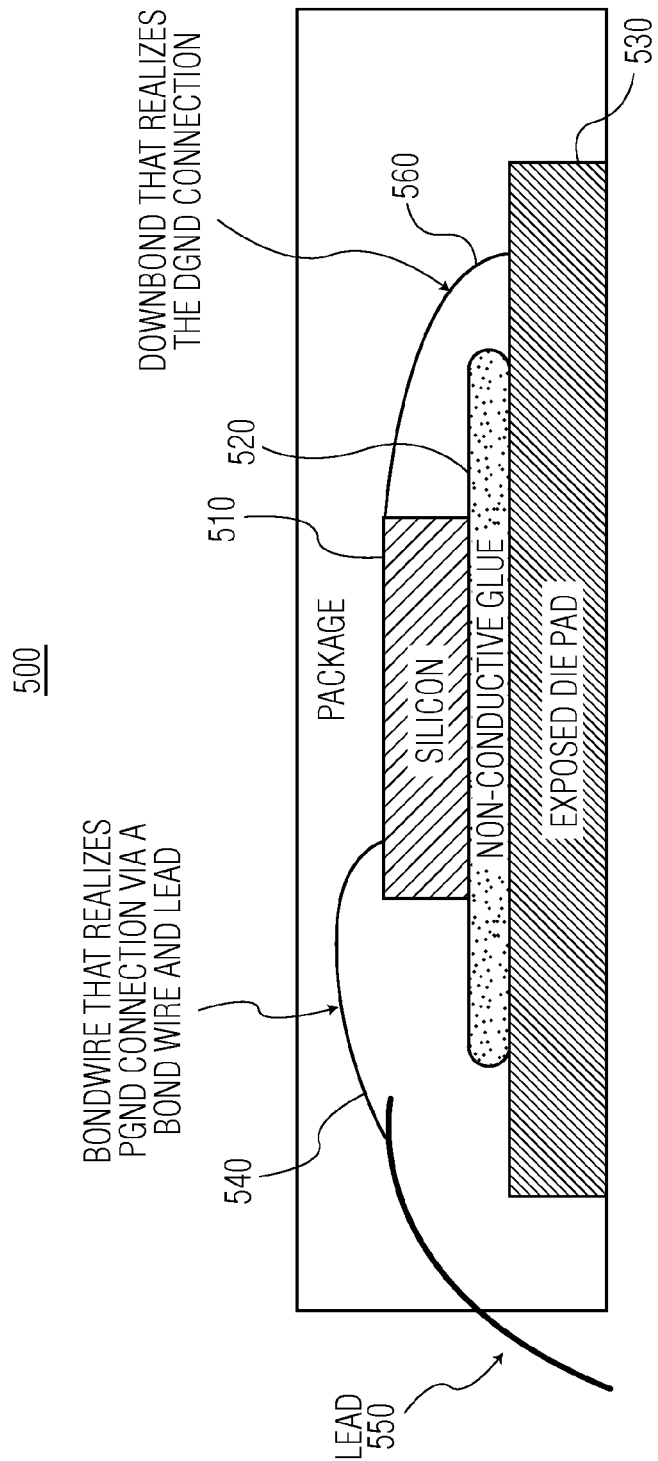
FIG. 5 illustrates a first embodiment of a die pad connection.

FIG. 5 illustrates a first embodiment of a die pad connection. As shown in FIG. 5, a PGND connection 500 may include silicon 510, non-conductive glue 520, and an exposed die pad 530. A bond wire 540 may couple silicon 510 to a lead 550. Conversely, a downbond 560 may couple silicon 510 to die pad 530.

Figure 6:
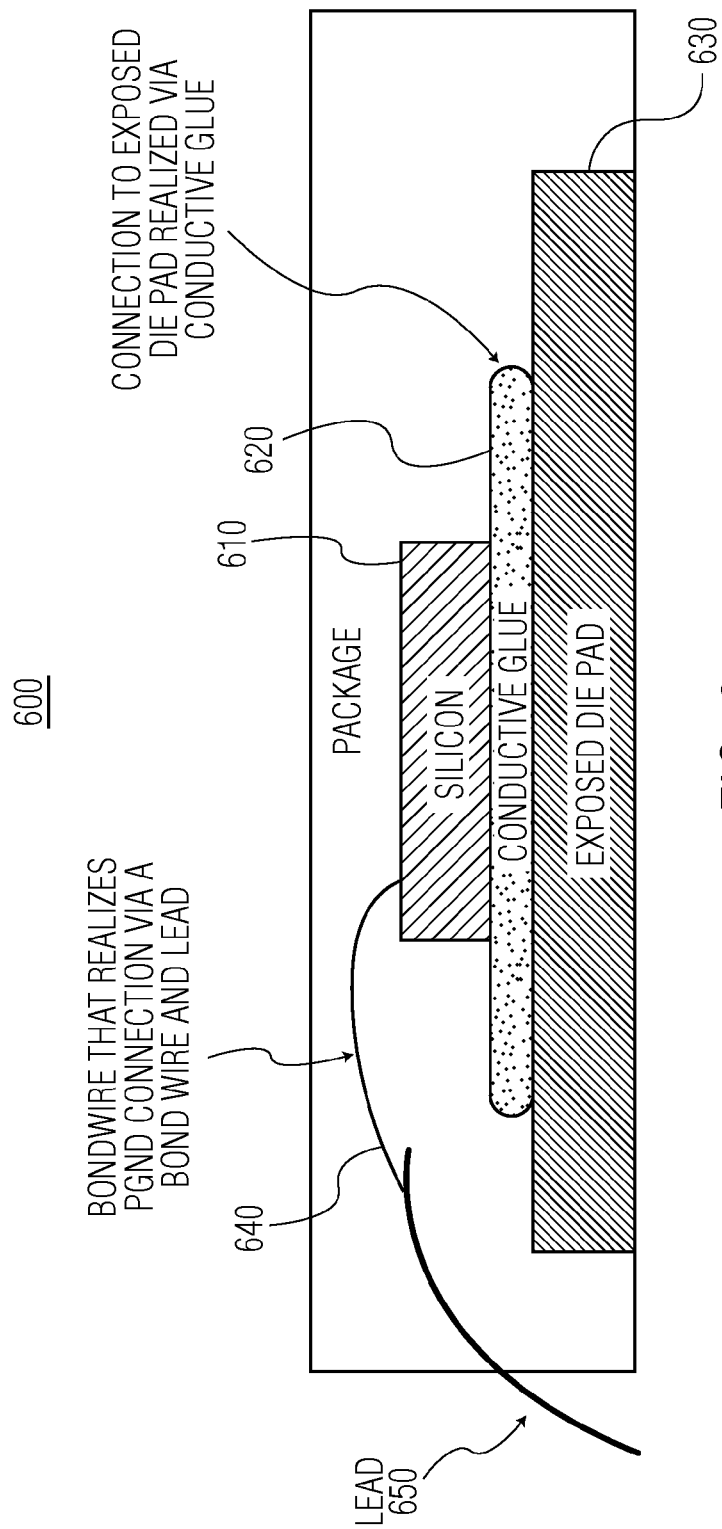
FIG. 6 illustrates a second embodiment of a die pad connection.

FIG. 6 illustrates a second embodiment of a die pad connection. As shown in FIG. 6, a PGND connection 600 may include silicon 610, conductive glue 620, and an exposed die pad 630. A bond wire 640 may couple silicon 610 to a lead 650. No downbond is present. In the second embodiment, conductive glue 620 may provide a connection between die pad 630 and silicon 620.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be made while remaining within the spirit and scope of the invention. Accordingly, the preceding disclosure, description, and figures are for illustrative purposes only and do not in any way limit the invention, which is defined only by the claims.

What is claimed is:

1. A system configured to supply power, the system comprising:
   a gate driver comprising at least one input buffer, at least one undervoltage monitor, at least one output driver, and an exposed die pad, wherein a ground of the at least one input buffer is coupled to the exposed die pad;
   a microcontroller coupled to the gate driver;
   a first ground coupled to both the exposed die pad and the microcontroller, wherein the first ground compensates for parasitic inductances of the at least one input buffer; and
   a second ground coupled to a connector of the gate driver.

2. The system of claim 1, further comprising:
   a downbond between silicon and the exposed die pad that provides the first ground.

3. The system of claim 1, further comprising:
   conductive glue between silicon and the exposed die pad that provides the first ground.

4. The system of claim 1, wherein the at least one input buffer comprises both a high input buffer and a low input buffer.

5. The system of claim 4, wherein grounds of both the high input buffer and the low input buffer are coupled to the first ground.

6. The system of claim 1, wherein the system has only eight connectors.

7. The system of claim 6, wherein the eight connectors are H, L, HC, HG, HS, LC, LG, and LS connectors.

8. The system of claim 7, wherein the microcontroller is coupled to both the H connector and the L connector.

9. The system of claim 1, wherein the at least one output driver further comprises:
a high output driver and a low output driver respectively coupled to HG and LG connectors.

10. The system of claim 9, further comprising:
a first transistor coupled to the HG connector; and
a second transistor coupled to the LG connector.

11. The system of claim 1, wherein the first ground is a digital ground and the second ground is an analog ground.

12. A gate driver comprising:
at least one input buffer;
at least one undervoltage monitor;
an exposed die pad that provides a digital ground;
at least one output driver, wherein a ground of the at least one input buffer is coupled to the exposed die pad, wherein the at least one output driver includes a high output driver and a low output driver; and
an output connector that provides an analog ground.

13. The gate driver of claim 12, wherein a downbond between silicon of the gate driver and the exposed die pad provides the digital ground.

14. The gate driver of claim 12, wherein conductive glue between silicon of the gate driver and the exposed die pad provides the digital ground.

15. The gate driver of claim 12, wherein the at least one input buffer further comprises:
a high input buffer; and
a low input buffer.

16. The gate driver of claim 15, wherein grounds of both the high input buffer and the low input buffer are coupled to the digital ground.

17. The gate driver of claim 12, wherein the high output driver and the low output driver are respectively coupled to HG and LG connectors.

18. The gate driver of claim 12, wherein the gate driver is implemented upon an Integrated Circuit (IC) having only eight connectors.

19. The gate driver of claim 18, wherein the eight connectors are H, L, HC, HG, HS, LC, LG, and LS connectors.

* * * * *